United States Patent [19]

Abe et al.

[11] Patent Number: 5,014,155

[45] Date of Patent: May 7, 1991

[54] CIRCUIT FOR PROTECTING INPUT OF SEMICONDUCTOR DEVICE

[75] Inventors: Noriyuki Abe; Takashi Kimura; Norio Fujiki, all of Kanagawa, Japan

[73] Assignee: Nissan Motor Company, Limited, Yokoyama, Japan

[21] Appl. No.: 365,466

[22] Filed: Jun. 13, 1989

[30] Foreign Application Priority Data

Jun. 13, 1988 [JP] Japan .................................. 63-143652
Jun. 13, 1988 [JP] Japan .................................. 63-143653

[51] Int. Cl.$^5$ ................................................ H02H 1/04
[52] U.S. Cl. ...................................... 361/56; 361/110; 307/542.1
[58] Field of Search .................... 361/56, 58, 110, 111; 307/518, 520, 353, 542.1

[56] References Cited

U.S. PATENT DOCUMENTS

| | | | |
|---|---|---|---|
| 3,967,295 | 6/1976 | Stewart | 307/542.1 |
| 4,417,155 | 11/1983 | Aizawa | 361/56 |
| 4,525,635 | 6/1985 | Gillberg | 307/542.1 |
| 4,761,566 | 8/1985 | Inoue et al. | 307/542.1 |

Primary Examiner—Todd E. Deboer

Attorney, Agent, or Firm—Foley & Lardner

[57] ABSTRACT

An input protection circuit for an electronic circuit includes a switching circuit operable between an ON state and an OFF state for generating an input for the electronic circuit, a first circuit responsive to an excess level of input for forming a clamping circuit across a first resistor for shunting an excess level input, a second circuit monitoring an input from the switching means for detecting a state of the switching circuit for producing an ON/OFF signal depending upon the detected state of the switching circuit, the second circuit including a second resistor which forms a series circuit with the first resistor and the switching circuits while the switching circuits is in an ON state. The switching circuits is operated to an ON position for establishing the series circuit for setting the level of the input at a minimum level and to an OFF position for opening the series circuit for setting the level of the input at a maximum level. The second circuit is set at a threshold level to be compared with the input level for detecting the state of the switching circuit, the threshold level being set at a level higher than the minimum level and lower than the maximum level so as to assure detection of the state of the switching circuits.

22 Claims, 5 Drawing Sheets

FIG. 6
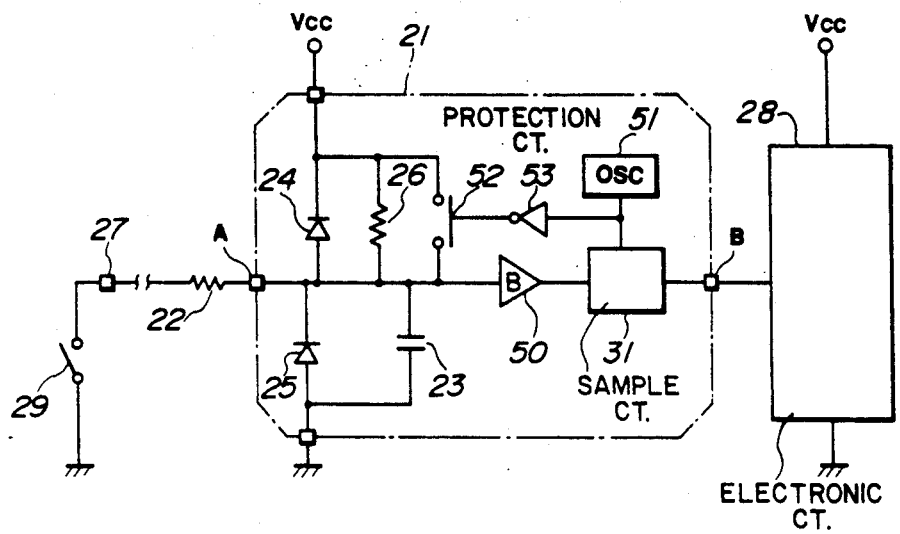
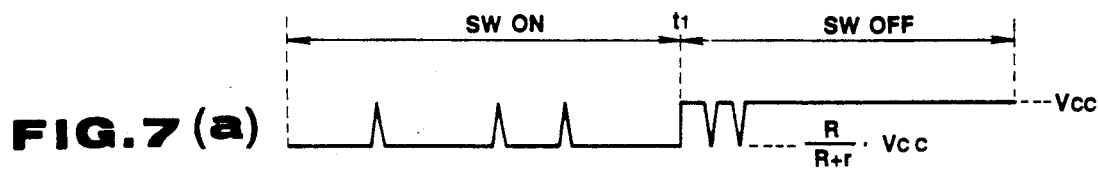
FIG.7(a)
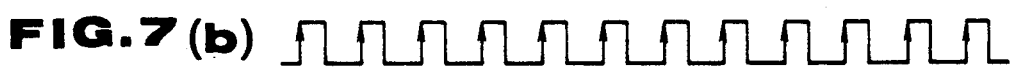
FIG.7(b)
FIG.7(c)
FIG.7(d)
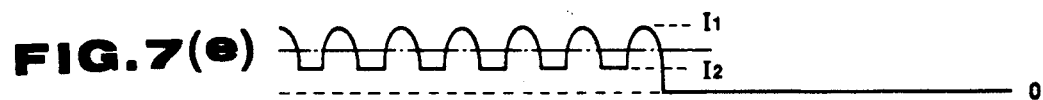
FIG.7(e)
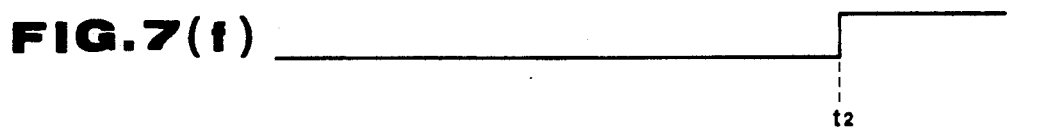
FIG.7(f)

CIRCUIT FOR PROTECTING INPUT OF SEMICONDUCTOR DEVICE

BACKGROUND OF THE INVENTION

1. Field of the Invention

The present invention relates generally to a circuit for protecting an electronic circuit from environmental noise. More specifically, the invention relates to a protection circuit for an input of a semiconductor device fabricated as an integrated circuit (IC) ship.

2. Description of the Background Art

Electric Science Series, Technical Report of CMOS Application, pages 47 to 48, published on 1980, by Sanpo Shuppan, discloses a protection circuit for an electronic circuit. The proposed circuit comprises a protection resistor, a capacitor and diodes for clamping the voltage. The protection circuit is fabricated as an external circuit of the electronic circuit and interposed between an input signal source and an input of the electronic circuit. The input signal source includes a pull-up resistor and a signal generating switch. A potential at a junction between the pull-up resistor and the signal generating switch, which potential is variable depending upon the position of the signal generating switch, serves as input for the electronic circuit. The protection circuit is generally designed for removing noise, such as surge voltage, electric wave distortion or chattering in switching, superimposed on the signal on a connection from the signal source to the input of the electronic circuit. In the prior proposed protection circuit, the noise component is removed by filtering the signal input to the electronic circuit by a time constant circuit determined by the capacity of a capacitor and the resistance of the protection resistor. Furthermore, the protection circuit is designed for protecting the electronic circuit from overcurrent and/or overvoltage which otherwise causes destruction of the electronic circuit.

In practical application, the protection circuit will be required to be capable of performing various. For example, in the case of the protection circuit applied to an automotive electronic circuit, the following performances are required.

(1) It is required to absorb several hundred volts of surge energy which can be induced in various loads.
(2) It is required to remove wave distortion noise due to environmental electromagnetic waves or high frequency noise pulses due to surging.
(3) As an additional required performance of the protection circuit for an automotive electronic circuit, it is required to have the capacity for maintaining sufficiently high contact current, e.g. normally 1 mA to 2 mA, for breaking an oxidation layer which is provided for protecting wiring from shorting otherwise caused by vibration, temperature or humidity in automotive use.

Such a protection circuit is very important for the durability of the electronic circuit. In view of this, a further high performance protection circuit has been required. Furthermore, for such a protection circuit requiring additional components for fabricating the electronic circuit, reduction of the fabricating cost and size is an extremely important task.

In order to answer the requirement for reduction of size, it has been proposed to form the protection circuit as an integrated circuit (IC). This may be particularly advantageous in employing an IC type protection circuit in the case when a plurality of input signal sources are connected to the electronic circuit. On the other hand, in view of production cost, it is preferred to fabricate the IC chip for the protection circuit as a monolithic IC instead of a hybrid IC, and it is further preferred that it be produced through an ordinary CMOS standard process without requiring a special process.

In practically fabricating the IC protection circuit, it is preferred to incorporate the pull-up resistor in IC form but to externally provide the protection resistor to which several hundreds volts is to be directly applied. For this purpose, there has been proposed a CMOS protection circuit as an IC circuit.

In such a CMOS protection circuit, the protection resistor is provided as an external component and the pull-up resistor is incorporated in the IC chip forming part of the circuit on the IC.

Such a prior proposed protection circuit is difficult to practically fabricate and to practically use. Namely, the resistance of the protection resistor has to be large enough to prevent the diodes in the protection circuit from causing latching-up. Assuming the possible surge voltage is $\pm 300$, and the current flowing through the diodes is greater than or equal to 100 mA, the required resistance R of the protection resistor can be illustrated by:

$$300\ (V)/R \leq 100\ (mA)$$

$$R \geq 3\ (k\omega) \qquad (1)$$

On the other hand, in order to assure breakage of an oxidation layer, the sum value of resistances of the protection resistor and the pull-up resistor is required to satisfy the following condition:

Assuming the contact point current of the IC is greater than or equal to 1 mA the power source voltage is 5 V, the sum value of the resistances of the protection resistor and the pull-up resistor is illustrated by:

$$5\ (V)/(R+r) \geq 1\ (mA)$$

$$R + r \leq 5\ (k\omega) \qquad (2)$$

From foregoing formula (1) and (2), the required resistance r of the pull-up resistor becomes smaller than or equal to 2 kω.

As can be appreciated herefrom, in the certain applications, it becomes necessary to set the resistance R of the protection resistor at a substantially greater value than that of the pull-up resistor. This makes it difficult to detect the state of the signal generating switch. Namely, when the signal generating switch is OFF, the input voltage becomes the source voltage Vcc and when the signal generating switch is ON, the input voltage becomes $(R \times Vcc)/(R+r)$. Therefore, when the resistance R of the protection resistor is greater than the resistance of the pull-up resistor, the voltage difference between the switch OFF state and ON state becomes smaller. This causes difficulty in setting a threshold level for detecting the ON and OFF states of the signal generating switch.

This problem is particularly serious when a buffer circuit is provided. Namely, in a normal case, the logical threshold voltage Vth of a CMOS buffer circuit is set at approximately half of the source voltage Vcc. This means that the input voltage has to be lower than half of the source voltage Vcc when the switch is in the ON state in order to allow detection of the ON state of the switch. For this, when the resistance R of the protection resistor is set to be greater than the resistance r of the pull-up resistor, the input voltage at the ON state of the switch becomes greater than the threshold voltage Vth. Therefore, in such case, detection of the state of the signal generating switch becomes impossible.

In order to solve this problem, the pull-up resistor has to be made as an external component of the IC chip. However, this clearly increases the complexity of the production process and the parts required for fabricating the IC chip. In other approach, it may be possible to solve the above-mentioned problem by applying a higher source voltage so as to increase the contact point current for assuring breakage of the oxidation layer. However, in a normal case, when the regulated power source for the electronic circuit is set at 5 V, another high voltage power source becomes necessary thus increasing the cost and causing chip size bulk.

SUMMARY OF THE INVENTION

Therefore, it is an object of the present invention to provide a novel and practically useful input protection circuit for an electronic circuit which can solve the problem in the prior proposed art without the necessity of extra parts or an extra process.

According to one aspect of the invention, an input protection circuit for an electronic circuit comprises:

a switching means operable between ON state and OFF state for generating an input for the electronic circuit;

a first circuit responsive to an excess level of the input for forming a clamping circuit across a first resistor for shunting an excess level input;

a second circuit monitoring an input from the switching means for detecting the state of the switching means for producing an ON/OFF signal depending upon the detected state of the switching means, the second circuit including a second resistor which forms a series circuit with the first resistor and the switching means while the switching means is in an ON state;

the switching means being operated to the ON position for establishing the series circuit for setting the level of the input at a minimum level and to the OFF position for blocking the series circuit for setting the level of the input at a maximum level; and the second circuit being set at a threshold level to be compared with the input level for detecting the state of the switching means, the threshold level being set at a level higher than the minimum level and lower than the maximum level so as to assure detection of the state of the switching means.

The first resistor may be provided with a first resistance value which is greater than a second resistance value of the second resistor. The first resistance of the first resistor is preferably set at a value for adjusting the current level upon occurrence of an excess level of input below a predetermined allowable maximum current value. Preferably, the second resistance of the second resistor is determined so that a sum value of the first and second resistances is set for adjusting a current level higher than a predetermined allowable minimum current level at a power source voltage.

The protection circuit may be generally fabricated as an integrated circuit, and the second resistor is formed as an external component interposed between the switching means and an input terminal of the integrated circuit. The second circuit may include a detector circuit receiving the input and detecting the state of the switching level on the basis of the input.

Preferably, the detector circuit comprises a comparator for comparing the input level with a predetermined threshold level. Alternatively, the detector circuit comprises a CMOS inverter.

The input protection circuit may further comprise means for sampling the output of the detector circuit and comparing sampled output levels over a predetermined sampling period for outputting a signal to be input to the electronic circuit for removing an error caused by temporarily occurring noise contained in the output of the detector.

In the alternative embodiment, the second circuit comprises a sampling the means for sampling output of the detector circuit and comparing sampled output levels over a predetermined sampling period for outputting a signal to be input to the electronic circuit for removing error caused by temporarily occurring noise contained in the output of the detector, a periodic signal generator for producing a periodic signal for a controlling sampling period of the sampling means, and a change over circuit means operable in synchronism with the periodic signal for establishing a by-pass circuit by-passing the second resistor during a period of the sampling period of the smapling means.

According to another aspect of the invention, an input protection circuit for an electronic circuit comprises:

clamping diodes connected between an input terminal connected to an input signal source including a signal generating switch and a power source terminal and between the input terminal and a grounding terminal;

a capacitor, one electrode of which is connected to the input terminal and the other electrode of which is connected to one of the power source terminal and the grounding terminal;

a pull resistor for performing at least one of pulling-up and pulling-down of the potential at the input terminal;

a detector circuit for detecting an ON and OFF position of the signal generating switch on the basis of the input at the input terminal;

a protection resistor disposed between the signal generating switch and the input terminal, which protection resistor forms a series circuit with the pull resistor and the signal generating switch when the signal generating switch is held at the ON position, which series circuit is opened while the signal generating switch is held OFF, and the protection resistor being provided with a greater resistance than that of the pull resistor.

According to a further aspect of the invention, an input protection circuit for an electronic circuit comprises:

clamping diodes connected between an input terminal connected to an input signal source including a signal generating switch and a power source terminal and between the input terminal and a grounding terminal;

a capacitor, one electrode of which is connected to the input terminal and the other electrode of which is connected to one of the power source terminal and the grounding terminal;

a pull resistor for performing at least one of pulling-up and pulling-down of the potential at the input terminal;

a semiconductor switch disposed in parallel with the pull resistor for establishing and blocking a by-pass circuit by-passing the pull resistor;

a buffer circuit connected to the input terminal;

a sampling circuit connected to the output of the buffer circuit for sampling the buffer output over a predetermined sampling period;

means for selectively operating the semiconductor switch and the sampling circuit for maintaining the semiconductor switch at an OFF position during a sampling period of the sampling circuit and maintaining the semiconductor switch at an ON position in a period of the sampling period; and a protection resistor disposed between the signal generating switch and the input terminal.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings:

FIG. 6 is a circuit diagram of the second embodiment of an input protection circuit for an electronic circuit, according to the present invention FIG. 7 is a timing chart showing waveforms of signals at various points in the circuit of FIG. 6

DESCRIPTION OF THE PREFERRED EMBODIMENT

Figure 1:
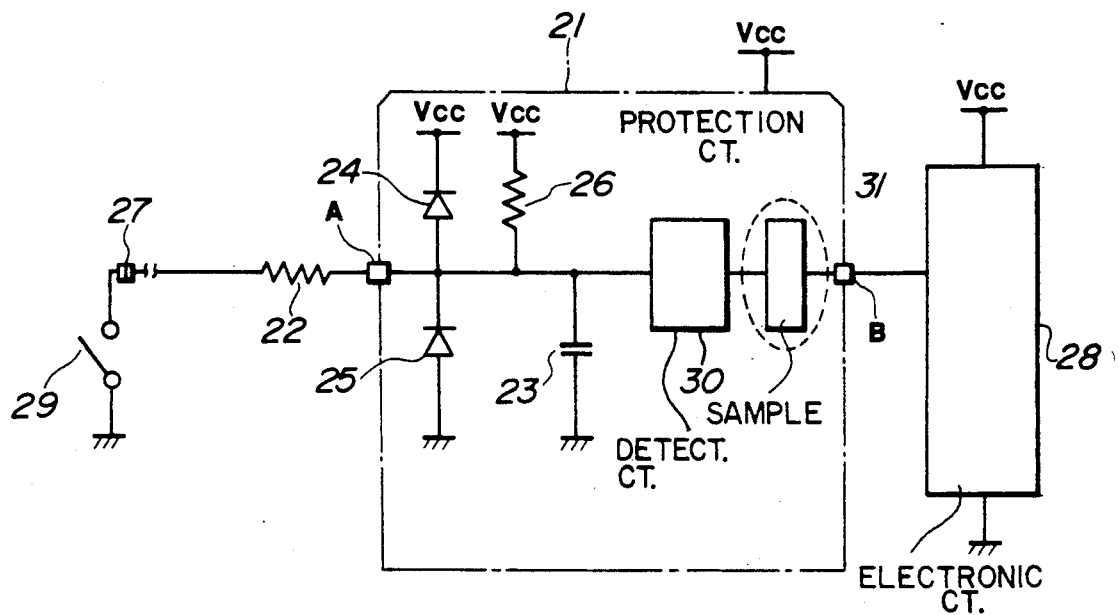
FIG. 1 is a circuit diagram of the first embodiment of an input protection circuit for an electronic circuit, according to the present invention

Referring now to the drawings, particularly to FIG. 1, the first embodiment of an input protection circuit 21, according to the present invention, is fabricate as an integrated circuit (IC). The input protection circuit 21 includes a capacitor 23, a diodes 24 and 25, a pull-up/pull-down resistor 26 and a detector circuit 30. The capacitor 23 is provided for removing high frequency noise having one electrode connected to terminal A and the other electrode connected to one of the grounding terminal or the power source terminal. On the other hand, the diodes 24 and 25 are arranged for clamping the voltage for protecting the electronic circuit from excessively high voltage. Although it is not essential, a sampling circuit 31 encircled by a broken line, can also be provided in the input protection circuit 21.

The input protection circuit 21 has an input terminal A connected to a signal generating switch 29 which serves as an input signal source, via a wiring connector 27 and an externally provided protection resistor 22. On the other hand, the output terminal B of the input protection circuit 21 is connected to an electronic circuit 28.

It should be appreciated that while FIG. 1 illustrates a single input protection circuit for one channel of input, it is possible to integrate a plurality of input protection circuits on a single IC chip. Therefore, FIG. 1 should be seen as a protection circuit which is only part of the IC chip.

It is advantageous to provide the sampling circuit 31 in the input protection circuit 21 for providing removal of chattering noise. Namely, in the case of IC chip, it is difficult to provide a large capacity for the capacitor 23. Because of this limited capacity, the filtering effect of the capacitor may not be satisfactory or complete. When the filtering effect is not complete, chattering may be caused superimposing chattering noise on the input signal. This can be successfully prevented by the sampling circuit 31. The sampling circuit 31 performs a comparing operation for comparing the instantaneous input signal with a given number of sampled immediately preceding input signals for outputting a signal corresponding to the instantaneous input signal only when the input signals are maintained constant over a predetermined occurrence. By employing this, chattering which can be caused by implusive noise is not outputted.

The detector circuit 30 is provided for detecting the state of the signal generating switch 29 based on the magnitude of current flowing through the protection resistor 22 and the pull-up resistor 26. In practice, the detector circuit 30 detects the input signal level at the input terminal A equal to a voltage Vcc input from a power source due to blocking of the current by the signal generating switch 29. In response to this, the detector circuit 30 makes judgement that the signal generating switch 29 is maintained at the OFF state to produce a HIGH level (1) detector signal. The detector circuit 30 also detects the voltage drop at the input terminal A below a predetermined threshold level Vth to make a judgement that the signal generating switch 29 is turned ON. In such case, the detector circuit 30 outputs LOW level (0) detector signal.

The detector circuit 30 is set the threshold level Vth at a level of:

$$Vth = K \times Vcc \qquad (3)$$

where K is determined so that, when the resistance of the protection resistor 22 is R and the resistance of the pull-up resistor 26 is r, K satisfies the following formula:

$$R/(R+r) < K < 1 \qquad (4)$$

and $$R > r \qquad (5)$$

Accordingly, from the foregoing formulae (3) and (4), the following formula can be established:

$$(R \times Vcc)/(R+r) < Vth < Vcc \qquad (6)$$

In practical operation, when the signal generating switch is held at OFF position, the protection resistor 22 is maintained at blocked state. Therefore, the potential $V_{off}$ at the input terminal A at the OFF state of the signal generating switch 29 is maintained at the source voltage Vcc. On the other hand, when the signal generating switch is in ON state, a grounding circuit via the pull-up resistor 26, the protection resistor 22 and the signal generating switch 29 is completed to permit flow of the current therethrough. At this time, the magnitude of current I flowing across the input terminal A can be illustrated by:

$$I = Vcc/(R+r)$$

Therefore, the potential $V_{on}$ at the input terminal at the ON state of the signal generating switch, can be illustrated by:

$$V_{on} = (R \times Vcc)/(R+r) \quad (7)$$

As can be seen herefrom, the threshold level is higher than the potential $V_{on}$ at the ON state of the signal generating switch and lower than the potential $V_{off}$ at the OFF state of the signal generating switch. Therefore, detection of the state of the signal generating switch can be assured.

In addition, since the resistance r of the pull-up resistor 26 is set at the smaller value than the resistance R of the protection resistor 22, it satisfies the condition of $$R \geq 3\ k\omega$$

$$(R+r) \leq 5\ k\omega$$

$$r \leq 2\ k\omega$$

Here, it is assumed that R is 3.3 kω and r is 1.5 kω. Since the foregoing formula (6) can be modified as:

$$3.3/(3.3+1.5) = 0.69 < K < 1$$

Therefore, 0.8 would be an appropriate value to set as K. Providing this, $$Id = 300\ (V)/3.3\ k = 91\ mA < 100\ mA$$

$$Ic = 5\ (V)/3.3\ k = 1.04\ mA > 1\ mA$$

Therefore, at ±300 V of surge voltage, the Id can be maintained lower than or equal at safety level, i.e. 100 mA. Also, to the normal level voltage, i.e. 5 V, satisfactorily high voltage (>1 mA) for breaking the oxidation layer can be provided.

As can be appreciated herefrom, according to the shown embodiment set forth above, it can be achieved absorption of several hundreds volts of surge energy which can be induced in various loads can be achieved. Furthermore, it becomes possible to remove wave distortion noise due to an environmental electromagnetic wave or a high frequency noise pulse due to surging. In addition, it becomes possible to have the capacity for maintaining sufficiently high contact current, e.g. normally 1 mA to 2 mA for breaking an oxidation layer which is provided for protecting wiring from shorting otherwise caused by vibration, temperature or humidity in automotive use.

Figure 2:
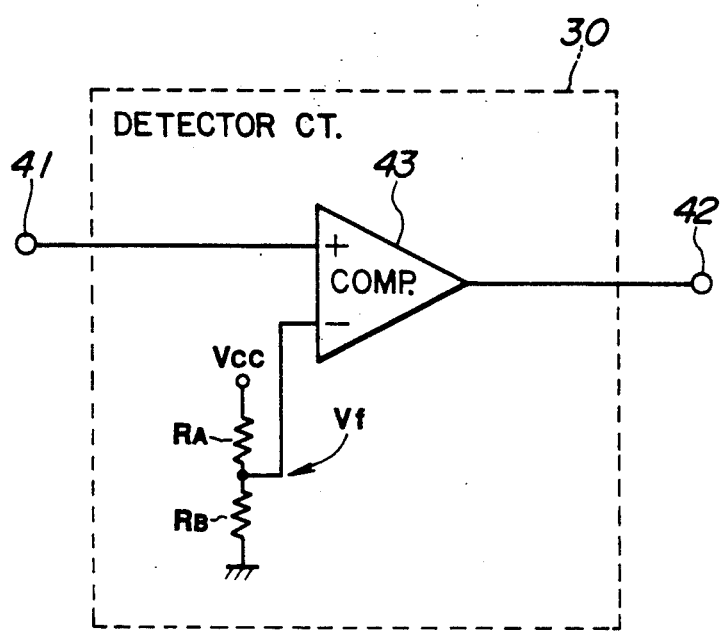
FIG. 2 is a circuit diagram of a detector circuit incorporated in the first embodiment of the input protection circuit of FIG. 1
Figure 3:
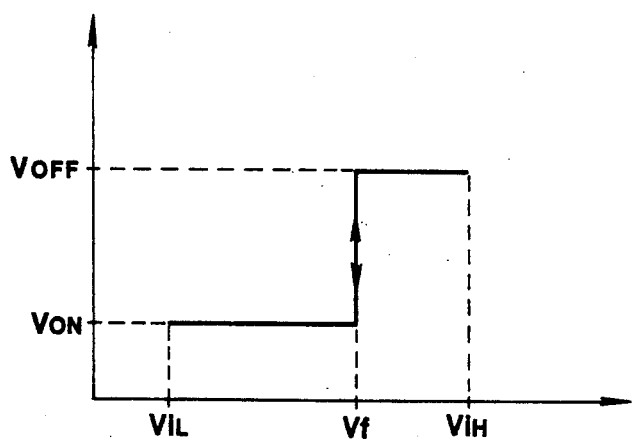
FIG. 3 is a chart showing variation of voltage in the circuit of FIG. 2

FIG. 2 shows one example of the detector circuit 30 to be employed in the foregoing first embodiment of the input protection circuit set forth above. As seen from FIG. 2, an input terminal 41 is connected to the input terminal A of the input protection circuit 21 of FIG. 1. On the other hand, the input terminal 41 is connected to the non-inverting input terminal of a comparator 43. On the other hand, the inverting input terminal of the comparator 43 is connected to a junction between voltage dividing resistors $R_A$ and $R_B$. The resistances of the resistors $R_A$ and $R_B$ are so selected to adjust the reference voltage $V_f$ generated at the junction at the level corresponding to the threshold level Vth. The output terminal of the comparator 43 is connected to an output terminal 42 of the detector circuit 30.

With the circuit construction set forth above, when the input ($V_{iH}$) for the non-inverting input terminal via the input terminal 41 is higher than the reference voltage $V_f$ input to the inverting input terminal, the comparator 43 outputs the HIGH level signal as the switch OFF state indicative signal. The HIGH level output of the comparator 43 thus serves as switch OFF state indicative signal $V_{OFF}$. On the other hand, when the input level via the input terminal 41 is lower than the reference voltage $V_f$, the LOW level signal representative of the switch ON state is output from the comparator 43. Therefore, the LOW level output of the comparator 43 serves as switch ON state indicative signal $V_{ON}$. The output signal of the comparator 43 is output via the output terminal 42 as the detector signal.

Figure 4:
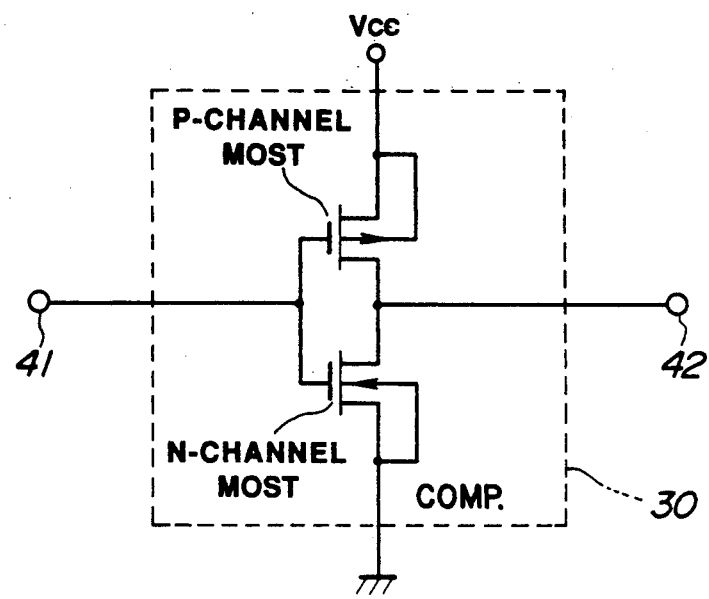
FIG. 4 is a circuit diagram of another example of the detector circuit incorporated in the first embodiment of the input protection circuit of FIG. 1

FIG. 4 shows another example of the detector circuit 30. In this example, the detector circuit 30 comprises a CMOS inverter. The threshold level of the CMOS inverter is determined to satisfy the condition set forth above. The threshold level $V_{LT}$ of a CMOS inverter is generally illustrated by the following formula:

$$V_{LT} = (Vcc + V_{Tp} + V_{Tn} \times /B_R)/(1 + /B_R)$$

where
$V_{Tp}$ is threshold voltage of P channel MOS transistor
$V_{Tn}$ is threshold voltage of N channel MOC transistor and
$B_R$ is a coefficient representative of the size of the transistor and can be illustrated by:

$$B_R = \{(W/L)n\}/\{(W/L)\}$$

where
W is a width of a gate of MOS transistor
L is a width of a channel of MOS transistor
(W/L)n is a W/L ratio of the N channel MOS transistor and
(W/L)p is a W/L ratio of the P channel MOS transistor.

Generally, the process constants are determined so that the threshold level $V_{LT}$ becomes approximately half of the source voltage Vcc. As can be seen from the foregoing discussion, the logical threshold level can be varied by adjusting $V_{Tp}$, $V_{Tn}$ or $B_R$. Therefore, the threshold level $V_{LT}$ can be appropriately adjusted in order to satisfy the foregoing condition. It should be noted that, in order to adjust $V_{Tp}$ and $V_{Tn}$, it becomes necessary to adjust the concentration of the impurity to be dopped in the channel region of the MOS transistors. Therefore, it would be more convenient to adjust the threshold level by adjusting $B_R$ by adjusting the size of the transistor. Namely, in order to satisfy the foregoing condition, the relationship (W/L)p > (W/L)n is established to set $B_R$ at a smaller value to satisfy 0.5 < K < 1.

Figure 5:
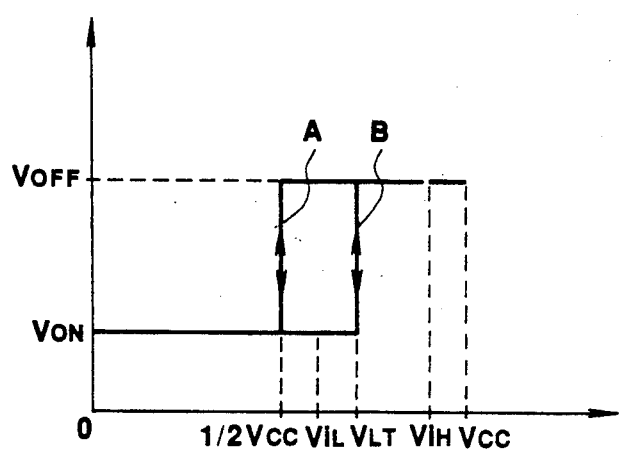
FIG. 5 is a chart showing variation of voltage in the circuit of FIG. 4

FIG. 5 shows variation of the CMOS inverter according to variation of the input signal level. In FIG. 5, line A shows a original threshold level (approximately half of Vcc) the CMOS inverter and line B shows shifted threshold level to satisfy the foregoing condition. As can be seen therefrom the shifted threshold level $V_{LT}$ is set between the input signal levels $V_{OFF}$ and $V_{ON}$ to assure detection of the switching state of the signal generating switch.

FIG. 6 shows the second embodiment of an input protection circuit for the electronic circuit according to the present invention. In the following discussion, the common elements to the foregoing first embodiment will be represented by the same reference numerals and neglected in the detailed discussion in order to avoid redundancy and confusion.

In the shown embodiment, the detector circuit in the former embodiment is replaced with a buffer circuit 50 associated with an oscillator 51, a switching circuit 52 and an inverter 53. The oscillator 51 generates periodic signal for periodically triggering the sampling circuit 31. Therefore, the periodic signal of the oscillator 51 controls the sampling period of the sampling circuit 31. The periodic signal is also fed to the switching circuit 52 via the inverter 53 for controlling the ON and OFF states of the switching circuit. Therefore, the switching circuit 52 is driven by the inverted periodic signal having opposite phase to that for the sampling circuit 31. As can be seen from FIG. 6, the switching circuit 52 is provided in parallel to the pull-up resistor 26. Therefore, when the switching circuit 52 is turned ON, a shorting circuit for the pull-up resistor 26 is established.

The buffer circuit 50 generally has a logical threshold level Vth which is half of the source voltage Vcc. Similarly to the former embodiment, the resistances R and r of the protection resistor 22 and the pull-up resistor 26 are determined so as to satisfy the following conditions:

$$(r \times Vcc)/(R+r) < (Vcc/2)$$

and $$(Vcc/R) > I_c$$

where Ic is the necessary current for causing breakage of the oxidation layer at the connector 27, e.g. higher than or equal to 1 mA.

The former formula has to be satisfied so that the threshold level Vth can be set at an appropriate level in order to assure detection of the ON and OFF states of the signal generating switch 29. Namely, when the signal generating switching is in ON state, the input signal level at the input terminal A is held lower than the threshold level Vth when the former formula is satisfied. On the other hand, the latter formula has to be satisfied so as to assure breakage of the oxidation layer in the connector 27 for assuring electrical signal transmission.

FIG. 7 shows waveforms at various points in the second embodiment of the input protection circuit of FIG. 6. FIG. 7(a) shows waveform showing variation of potential at the input terminal while the switching circuit 52 is maintained at OFF state. The waveform shown occurs upon turning the signal generating switch 29 from an ON state to an OFF state. As can be seen from FIG. 7(a), triangular spike noises are superimposed on the input signals, which triangular spikes are generated in various source.

FIG. 7(b) shows the waveform of the periodic signal generated by the oscillator. The waveform of the output of the inverter 53 has opposite phase to the periodic signal of the oscillator 51, as shown in FIG. 7(c). While the inverter output is maintained at HIGH level, the switching circuit 52 is in ON state for shorting the pull-up resistor 26. Therefore, the source voltage Vcc is directly supplied to the protection resistor 22. By alternating the switch position between ON and OFF for the switching circuit 52, the potential at the input terminal A varies as shown in FIG. 7(d). As can be seen from FIG. 7(d), the potential at the input terminal A becomes HIGH level irrespective of the switch position of the signal generating switch 29 while the switching circuit 52 is held ON. Therefore, by the effect of the switching circuit 52, the potential at the input terminal A falls LOW only when the switching circuit 52 is held OFF and the signal generating switch 29 is held ON.

The potential at the input terminal A is periodically sampled by the sampling circuit 31 in synchronism with the periodic signal of the oscillator 51. The sampling circuit 31 performs a comparing operation as set forth with respect to the former embodiment so as to remove variation of the potential at the input terminal A caused by alternation of the switch position of the switching circuit 52. Therefore, as can be seen from FIG. 7(f), the sampling circuit 31 extracts the factor showing the ON and OFF state of the signal generating switch 29. As can be seen from FIG. 7(f), the output level of the sampling circuit 31 turns into HIGH level at a time $t_2$ with a delay time from a time $t_1$ at which the signal generating switch 29 is actually turned OFF. This delay corresponds to the number of periodic signals, which number corresponds to the number of sampled input signal data to be compared in the sampling circuit 31.

FIG. 7(e) shows current flowing through the protection resistor 22. As can be seen, the current through the protection resistor 22 flows in a pulsating form. While the signal generating switch 29 is held OFF, the circuit through the protection resistor 22 is broken. Therefore, no current flows through the protection resistor 22. When the switching circuit 52 is in the ON state, current $I_1$ flows through the protection resistor 22. On the other hand, when the switching circuit 52 is in the OFF state, current $I_2$ flows through the protection resistor 22 and the pull-up resistor 26.

The current value of the currents $I_1$ and $I_2$ can be illustrated by the following equations:

$$I_1 = Vcc/R$$

$$I_2 = Vcc/(R+r)$$

The current flowing through the protection resistor 22 thus varies between the maximum value $I_1$ and the minimum value $I_2$ across an average value $I_0$. The average current value $I_0$ is set at a value greater than a standard value, i.e. 1 mA. However, it is not essential to set the average current value $I_0$ at a greater value than the standard value. Namely, the oxidation layer has the property that conductivity is maintained after once broken by a greater current than the standard current, even when the current value drops below the standard value. Therefore, as long as the maximum current $I_1$ is greater than the standard value, the average value can be below the standard value.

In the foregoing embodiment, while the sampling circuit 31 performs sampling of the input signals through the input terminal A, the switching circuit 52 is held OFF to establish the circuit through the pull-up resistor 26 and the protection resistor 22. By this method, the relatively large voltage variation is caused depending upon the switch position of the signal generating switch 27 to adjust the potential at the input terminal A during the On state of the signal generating switch 29 below the threshold level Vth (=Vcc/2). On the other hand, while the smapling circuit 31 is not active, the pull-up resistor 26 is by-passed for providing increased current for assured signal transmission through the connector 27.

Figure 8:
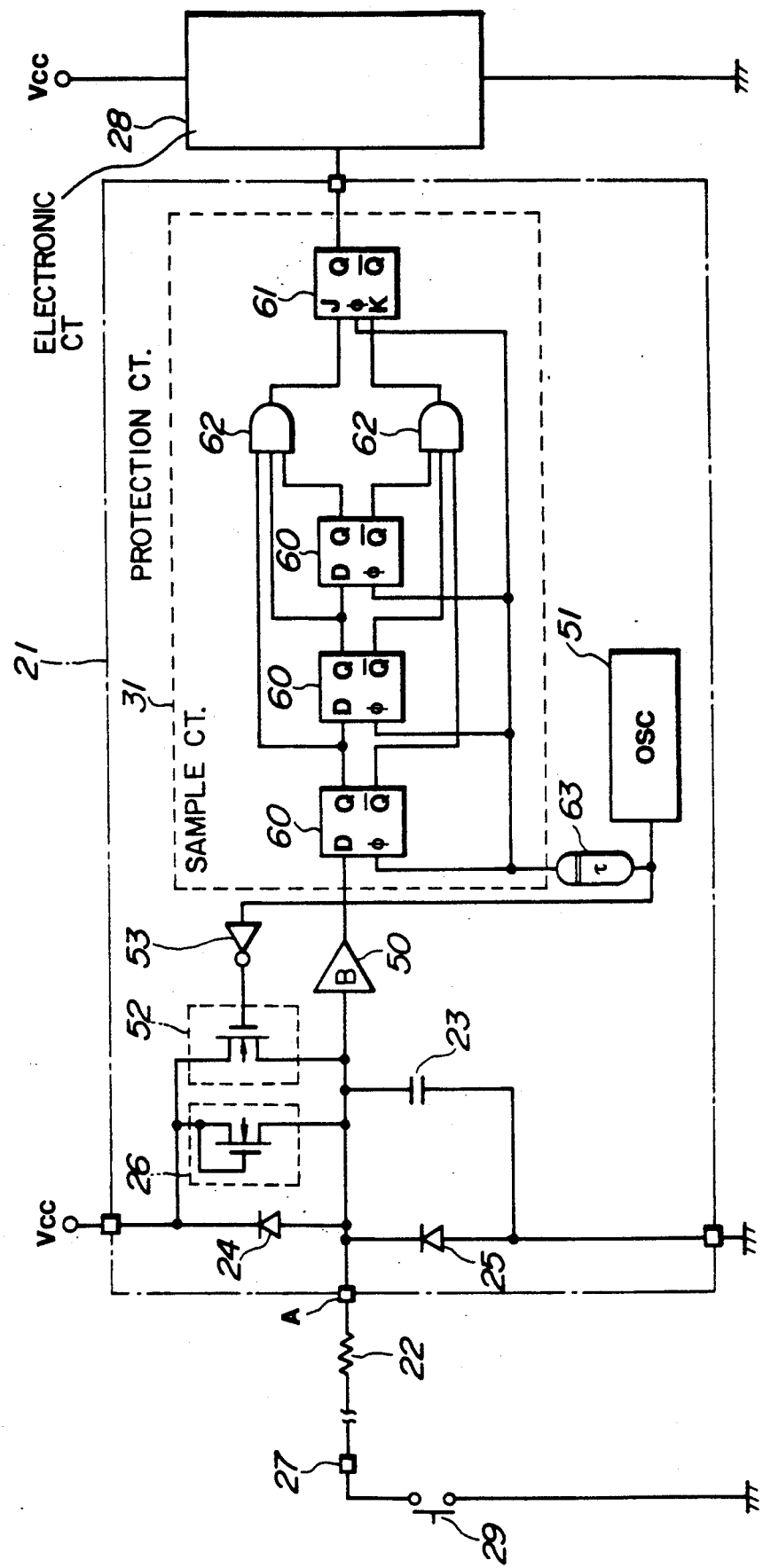
FIG. 8 is a diagram of an integrated circuit of the input protection circuit, which illustrates actual implementation of the second embodiment of the input protection circuit of FIG. 6.

FIG. 8 shows practical implementation of the second embodiment of the input protection circuit of FIG. 6. The construction of the protection circuit shown is fabricated as an IC chip. As can be seen FIG. 8, the pull-up resistor 26 and the switching circuit 52 are formed by MOS transistors utilizing the ON/OFF resistance thereof. It may also be possible to form the pull-up resistor 26 by a diffusion resistor. On the other hand, the sampling circuit 31 is formed by D flip-flop 60, JK flip-flop 61 and AND gates 62. In addition, a delay element 63 is provided for providing a set-up hold time for the JK flip-flop 62.

As is clear from this, according to the embodiment shown, all elements for formulating the input protection circuit can be fabricated through a standard MOS process. Therefore, the production process can be simplified and thus can substantially reduce the production cost without degrading performance.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the embodiments shown which can be embodied without departing from the principle of the invention set out in the appended claims.

What is claimed is:

1. An input protection circuit for an electronic circuit comprising:
   switching means operable between an ON state and an OFF state for generating an input provided for said electronic circuit through a first resistor;
   a first circuit responsive to an excess level of said input for forming a clamping circuit across said first resistor for shunting an excess level input;
   a second circuit monitoring said input from said switching means for detecting a state of said switching means for producing an ON/OFF signal depending upon a detected state of said switching means, said second circuit including a second resistor which forms a series circuit with said first resistor and said switching means while said switching means is in said ON state;
   said switching means being operated to said ON state for establishing said series circuit for setting an input level at a predetermined minimum level and to said OFF state for opening said series circuit for setting an input level at a predetermined maximum level; and
   said second circuit being set at a threshold level to be compared with an input level for detecting a state of said switching means, said threshold level being set at a level higher than said minimum level and lower than said maximum level in a range satisfying $R \cdot Vcc/(R+r) < Vth < Vcc$ wherein
   Vcc: power source voltage
   R: resistance of said first resistor
   r: resistance of said second resistor, so as to assure detection of a state of said switching means.

2. An input protection circuit as set forth in claim 1, wherein said first resistor has a first resistance value which is greater than a second resistance value of said second resistor.

3. An input protection circuit as set forth in claim 2, wherein said first resistance value of said first resistor is set at a value for determining a current level upon occurrence of an excess level of said input below a predetermined allowable maximum current value.

4. An input protection circuit as set forth in claim 3, wherein said second resistance of said second resistor is determined so that a sum value of said first and second resistances is set for determining a current level higher than a predetermined allowable minimum current level at a given power source voltage.

5. An input protection circuit as set forth in claim 4, in which said protection circuit is generally fabricated as an integrated circuit and said first resistor is formed as an external component interposed between said switching means and an input terminal of said integrated circuit.

6. An input protection circuit as set forth in claim 1, wherein said second circuit includes a detector circuit receiving said input and detecting a state of said switching means on the basis of said input.

7. An input protection circuit as set forth in claim 6, wherein said detector circuit comprises a comparator for comparing an input level with a predetermined threshold level.

8. An input protection circuit as set forth in claim 6, wherein said detector circuit comprises a CMOS inverter.

9. An input protection circuit as set forth in claim 6, which further comprises; means for sampling an output of said detector circuit and comparing sampled output levels over predetermined sampling periods for outputting a signal to be input to said electronic circuit by removing error caused by temporarily occurring noise contained in said output of said detector.

10. An input protection circuit as set forth in claim 1, wherein said second circuit comprises sampling means for sampling an output of a detector circuit and comparing sampled output levels over a predetermined sampling periods for outputting a signal to be input to said electronic circuit having error caused by temporarily occurring noise contained in said output of said detector removed, a periodic signal generator for producing a periodic signal for controlling a sampling period of said sampling means, and a change over circuit means operable in synchronism with said periodic signal for establishing a by-pass circuit for by-passing said second resistor during a period of said sampling period of said sampling means.

11. An input protection circuit as set forth in claim 10, wherein said first resistor has a first resistance value which is greater than a second resistance value of said second resistor.

12. An input protection circuit as set forth in claim 11, wherein said first resistance value of said first resistor is set at a value for determining a current level upon occurrence of an excess level of input below a predetermined allowable maximum current value.

13. An input protection circuit as set forth in claim 12, wherein said second resistance value of said second resistor is determined so that a sum value of first and second resistance values is set for determining a current level higher than a predetermined allowable minimum current level at a given power source voltage.

14. An input protection circuit as set forth in claim 13, in which said protection circuit is fabricated as an integrated circuit and said first resistor is formed as an external component interposed between said switching means and an input terminal of said integrated circuit.

15. An input protection circuit for an electronic circuit comprising:

clamping diodes respectively connected between an input terminal connected to an input signal source including a signal generating switch and a power source terminal and between said input terminal and a grounding terminal;

a capacitor, one electrode of which is connected to said input terminal and the other electrode of which is connected to one of said power source terminal and said grounding terminal;

a pull resistor for performing at least one of pulling-up and pulling-down of an input at said input terminal;

a protection resistor disposed between said signal generating switch and said input terminal, said protection resistor forming a series circuit with said pull resistor and said signal generating switch when said signal generating switch is held at an ON position, said series circuit being open while said signal generating switch is held at an OFF position, and said protection resistor having a greater resistance value than that of said pull resistor.

16. An input protection circuit for an electronic circuit comprising:

clamping diodes respectively connected between an input terminal connected to an input signal source including a signal generating switch and a power source terminal and between said input terminal and a grounding terminal;

a capacitor, one electrode of which is connected to said input terminal and the other electrode of which is connected to one of said power source terminal and said grounding terminal;

a pull resistor for performing at least one of pulling-up and pulling-down of a potential at said input terminal;

a semiconductor switch disposed in parallel with said pull resistor for establishing and opening a by-pass circuit by-passing said pull resistor;

a buffer circuit connected to said input terminal;

a sampling circuit connected to an output of said buffer circuit for sampling said output over a predetermined sampling period;

means for selectively operating said semiconductor switch and said sampling circuit for maintaining said semiconductor switch at an OFF condition during a sampling period of said sampling circuit and maintaining said semiconductor switch at an ON condition in a period of said sampling period; and a protection resistor disposed between said signal generating switch and said input terminal.

17. An input protection circuit for an electronic circuit comprising:

switching means operable between an ON state and an OFF state for generating an input provided for said electronic circuit through a first resistor;

a first circuit responsive to an excess level of said input for forming a clamping circuit across said first resistor for shunting an excess level input;

a second circuit monitoring said input from said switching means for detecting a state of said switching means for producing an ON/OFF signal depending upon a detected state of said switching means, said second circuit including a second resistor which forms a series circuit with said first resistor while said switching means is in said ON state;

said switching means being operated to said ON state for establishing said series circuit for setting an input level at a predetermined minimum level and to said OFF state for opening said series circuit for setting an input at a predetermined maximum level;

said second circuit being set at a threshold level to be compared with an input level for detecting a state of said switching means, said threshold level being set at a level higher than said minimum level and lower than said maximum level so as to assure detection of a state of said switching means;

and said first resistor having a first resistance value which is greater than a second resistance value of said second resistor.

18. An input protection circuit for an electronic circuit comprising:

switching means operable between an ON state and an OFF state for generating an input provided for said electronic circuit through a first resistor;

a first circuit responsive to an excess level of said input for forming a clamping circuit across said first resistor for shunting an excess level input;

a second circuit monitoring said input from said switching means for detecting a state of said switching means for producing an ON/OFF signal depending upon a detected state of said switching means, said second circuit including a second resistor which forms a series circuit with said first resistor while said switching means is in said ON state;

said switching means being operated to said ON state for establishing said series circuit for setting an input level at a predetermined minimum level and to said OFF position for opening said series circuit for setting an input at a predetermined maximum level; and said first resistor having a first resistance value which is greater than a second resistance value of said second resistor.

19. An input protection circuit for an electronic circuit comprising:

switching means operable between an ON state and an OFF state for generating an input provided for said electronic circuit through a first resistor;

a first circuit responsive to an excess level of said input for forming a clamping circuit across said first resistor for shunting an excess level input;

a second circuit monitoring said input from said switching means for detecting a state of said switching means for producing an ON/OFF signal depending upon a detected state of said switching means, said second circuit including a second resistor which forms a series circuit with said first resistor and said switching means while said switching means is in said ON state;

said switching means being operated to said ON state for establishing said series circuit for setting an input level at a predetermined minimum level and to said OFF state opening said series circuit for setting an input at a predetermined maximum level;

said second circuit being set at a threshold level to be compared with an input level for detecting a state of said switching means, said threshold level being set at a level higher than said minimum level and lower than said maximum level so as to assure detection of a state of said switching means;

said second circuit comprising sampling means for sampling an output of a detector circuit and comparing sampled output levels over a predetermined sampling period for outputting a signal to be input to said electronic circuit havng error caused by temporarily occurring noise contained in said output of said detector removed, a periodic signal generator for producing a periodic signal for controlling a sampling period of said sampling means, and change over circuit means operable in synchronism with said periodic signal for establishing a by-pass circuit for by-passing said second resistor during a period of said sampling period of said sampling means; and said first resistor having a first resistance value which is greater than a second resistance value of said second resistor.

20. An input protection circuit as set forth in claim 19, wherein said first resistance value of said first resistor is set at a value for determining a current level upon occurrence of an excess level of input below a predetermined allowable maximum current.

21. An input protection circuit as set forth in claim 20, wherein said second resistance value of said second resistor is determined so that a sum value of said first and second resistances is set for determining a current level higher than a predetermined allowable minimum current level at a given power source voltage.

22. An input protection circuit as set forth in claim 21, in which said protection circuit is fabricated as an integrated circuit and said first resistor is formed as an external component interposed between said switching means and an input terminal of said integrated circuit.

* * * * *